United States Patent
Huang et al.

(10) Patent No.: US 6,936,544 B2
(45) Date of Patent: Aug. 30, 2005

(54) METHOD OF REMOVING METAL ETCHING RESIDUES FOLLOWING A METAL ETCHBACK PROCESS TO IMPROVE A CMP PROCESS

(75) Inventors: Yai-Yei Huang, Hsinchu (TW); Yuh-Da Fan, Hsinchu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 238 days.

(21) Appl. No.: 10/385,767

(22) Filed: Mar. 11, 2003

(65) Prior Publication Data

US 2004/0178172 A1 Sep. 16, 2004

(51) Int. Cl.[7] .............................................. H01L 21/302
(52) U.S. Cl. ...................... 438/692; 438/691; 438/697; 438/706; 134/1.2
(58) Field of Search ................................. 438/637, 639, 438/652, 687, 691, 692, 697, 706, 710, 700, 714; 134/1.1, 1.2, 2

(56) References Cited

U.S. PATENT DOCUMENTS

| | | | | |
|---|---|---|---|---|
| 5,904,560 A | * | 5/1999 | Brumley | 438/639 |
| 6,143,658 A | * | 11/2000 | Donnelly et al. | 438/687 |
| 6,187,684 B1 | * | 2/2001 | Farber et al. | 438/704 |
| 6,214,688 B1 | * | 4/2001 | Hwang et al. | 438/396 |
| 6,528,386 B1 | * | 3/2003 | Summerfelt et al. | 438/401 |
| 6,635,528 B2 | * | 10/2003 | Gilbert et al. | 438/253 |
| 6,780,785 B2 | * | 8/2004 | Hsieh | 438/745 |

* cited by examiner

Primary Examiner—Lan Vinh
(74) Attorney, Agent, or Firm—Tung & Associates

(57) ABSTRACT

A method for reducing wafer surface scratching in a metal CMP process including providing a semiconductor wafer having a process surface comprising a blanket deposited metal layer; dry etching in an etchback process comprising a fluorine containing etching chemistry to remove at least a portion of the metal layer forming a metal and fluorine containing etching residue at the process surface; cleaning the process surface with a hydrofluoric acid (HF) containing cleaning solution; and carrying out a subsequent metal chemical mechanical polishing (CMP) process.

22 Claims, 2 Drawing Sheets

METHOD OF REMOVING METAL ETCHING RESIDUES FOLLOWING A METAL ETCHBACK PROCESS TO IMPROVE A CMP PROCESS

FIELD OF THE INVENTION

This invention generally relates to semiconductor processing methods including formation of metallization plugs and more particularly to a method to reduce CMP scratching caused by metallic residue contamination formed during a metal etchback process.

BACKGROUND OF THE INVENTION

Metallization interconnects are critical to the proper electronic function of semiconductor devices. Several advances in semiconductor processing have been aimed at improving signal transport speed by reducing metal interconnect resistivities and improving resistance to electromigration effects. Copper has increasingly become a metal of choice in, for example, upper levels of metallization in a multi-level semiconductor device due to its low resistivity and higher resistance to electromigration. Tungsten is still preferred for use in the lower metallization layers adjacent to the silicon substrate since it provides an effective diffusion barrier to metal diffusion from overlying metallization layers to react with the silicon substrate. Tungsten further has high resistance to electromigration and can effectively be used to fill high aspect ratio vias by chemical vapor deposition (CVD) processes.

A serious problem in tungsten plug formation according to prior art methods of using a dry etchback process to remove the tungsten metal above the via level is that during the dry etchback process residual metal containing particles ranging in size from about 0.5 microns to about 40 microns frequently remain on the wafer process surface. Following the tungsten etchback process a CMP process may be subsequently used to complete the removal of excess tungsten above the plug level or to remove an underlying barrier layer blanket deposited to line the plug prior to tungsten deposition. A major problem in tungsten plug formation process is the scratching of the process wafer surface caused by the residual particles or etching residue in a subsequent CMP process.

Prior art processes been attempted cleaning the wafer surface of tungsten particles by wet methods typically including deionized water together with scrubbing. These methods have not been entirely successful and have been found in many cases to fail to reduce the level of scratching in subsequent CMP processes.

Therefore, there is a need in the semiconductor processing art to develop a method for a reliable cleaning process following a metal etchback to remove metal containing etching residue produced during the metal etchback process in order to improve a subsequent CMP process.

It is therefore an object of the invention to provide a method for a reliable cleaning process following a metal etchback to remove metal containing etching residue produced during the metal etchback process in order to improve a subsequent CMP process while overcoming other shortcomings of the prior art.

SUMMARY OF THE INVENTION

To achieve the foregoing and other objects, and in accordance with the purposes of the present invention, as embodied and broadly described herein, the present invention provides a method for reducing wafer surface scratching in a metal CMP process.

In a first embodiment, the method includes providing a semiconductor wafer having a process surface comprising a blanket deposited metal layer; dry etching in an etchback process comprising a fluorine containing etching chemistry to remove at least a portion of the metal layer forming a metal and fluorine containing etching residue at the process surface; cleaning the process surface with a hydrofluoric acid (HF) containing cleaning solution; and, carrying out a subsequent metal chemical mechanical polishing (CMP) process.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained by reference to formation of a tungsten plug, it will be appreciated that the method of the present invention may be advantageously applied to any metal plug formation process where residual metallic contaminates form on a process surface whereby components in the etching chemistry have chemically reacted with a metal layer in a dry etchback process to produce a metal containing etching by-product at the process surface.

In a first embodiment, the method includes providing a semiconductor wafer including a dielectric insulating layer having plug openings lined with a barrier layer formed according to a blanket deposition process and an overlying first metal layer formed according to a blanket deposition process filling the plug openings; dry etching in an etchback process to remove at least a portion of the first metal layer above the plug opening level while forming a metallic etching residue by reaction with an etching chemistry on the wafer surface; and, performing a post etchback wet cleaning process using a hydrogen fluoride (HF) containing solution to remove the metallic etching residue.

In subsequent processes, a second metal layer is deposited over the wafer surface followed by a chemical mechanical polishing (CMP) to remove at least a portion of the second metal layer overlying the plug level.

In one embodiment, the etching chemistry includes fluorine. In another embodiment, the etching chemistry includes both fluorine and sulfur, for example, $SF_6$. Preferably, the metallic etching residue includes fluorine formed by chemical reaction between the fluorine containing etching gases and the metal etching target surface. In another embodiment, the metal etching target surface is a titanium containing metal, for example at least one of a titanium nitride or titanium containing barrier layer. In a preferred embodiment, the second metal layer is a titanium containing metal, for example at least one of a titanium nitride or titanium, and the metal CMP process is a titanium metal CMP process.

Figure 1A:
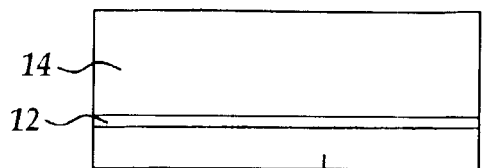
FIGS. 1A–1F are cross sectional side view representations of a portion of a semiconductor wafer at stages in device manufacture according to the method of the present invention.

Referring to FIGS. 1A–1F, in an exemplary embodiment of the method of the present invention, side view portions of a semiconductor wafer are shown at stages in a semiconductor device integrated circuit manufacturing process. Referring to FIG. 1A, a first metal layer 10, for example a contact layer formed of an aluminum:copper alloy is deposited by conventional methods, for example, physical vapor deposition (PVD). A first barrier layer 12, for example a titanium/titanium nitride layer, is provided over the metal layer 10. For example, a titanium/titanium nitride (e.g., Ti/TiN) layer is deposited by conventional PVD and CVD methods, for example, first depositing Ti by a PVD process followed by a low pressure CVD (LPCVD) process to deposit TiN, to a thickness of about 50 to about 300 Angstroms. Overlying the first barrier layer 12 is formed an inter-metal dielectric (IMD) layer 14, formed of, for example TEOS (tetra-ethyl-ortho-silicate) silicon dioxide, and optionally including a dopant such as fluorine or carbon to lower the dielectric constant. The IMD layer is typically formed by plasma enhanced CVD (e.g., PECVD or HDP-CVD) deposited to a thickness of about 3,000 to about 7,000 Angstroms. An anti-reflectance (ARC) layer (not shown), for example titanium nitride, is optionally deposited over the IMD layer 14 to reduce light reflections in a subsequent photolithographic patterning process to form a plug opening etching pattern.

Figure 1B:
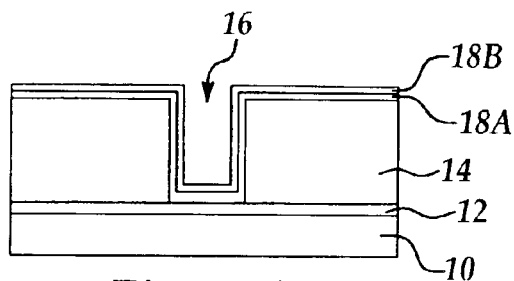

Referring to FIG. 1B, following a conventional photolithographic patterning and anisotropic etching process a plug opening 16 is anisotropically etched by a conventional RIE process, for example including fluorocarbon and hydrofluorocarbon etching chemistries in a multi-step process, including etching through the IMD layer, and barrier layer 12 to form closed communication with the underlying metal layer 10. A second barrier layer, for example, a titanium/titanium nitride bilayer e.g., 18A and 1B, is blanket deposited over the plug opening to line the plug opening 16 at a thickness of about 50 Angstroms to about 300 Angstroms by conventional PVD and. CVD processes. More preferably, for example, in the formation of integrated circuits used for image sensors, a PVD layer of titanium (Ti) e.g., 18A is first deposited at a thickness of about 50 to about 200 Angstroms followed by formation of a CVD layer 18B of titanium nitride to form a barrier layer having a total thickness of 200 to about 300 Angstroms to improve a subsequent conventional tungsten metal filling CVD process. For example, it has been found that the titanium layer 18A including the overlying CVD titanium nitride layer 18B improves the tungsten filling process to reduce the formation of keyholes or voids in a subsequent tungsten deposition process filling plug opening 16 to form a tungsten plug.

Figure 1C:
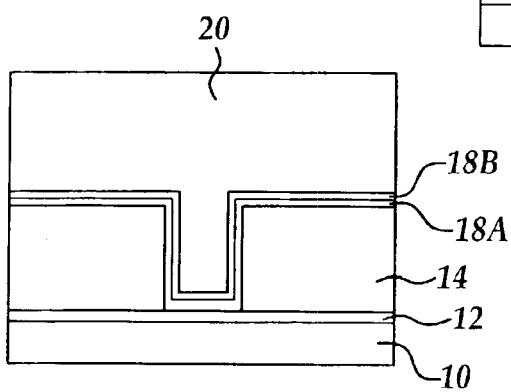
Figure 1D:
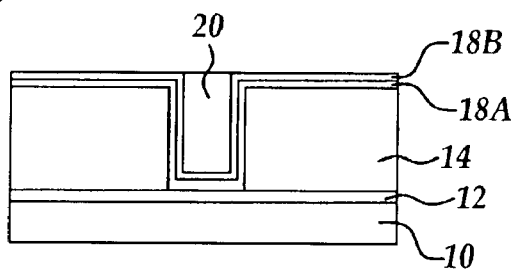

Referring to FIG. 1C, tungsten is blanket deposited by a conventional CVD process, for example by using hydrogen and/or silane reduction of $WF_6$ by a low pressure CVD (LPCVD) process carried out at about 350° C. to 450° C., to fill the plug opening 16 and form an overlying tungsten layer 20 over the barrier bilayer 18A and 18B. Referring to FIG. 1D, the tungsten metal layer 18 overlying the barrier layers 18A and 18B above the plug level 16 is then removed according to a dry etchback process to at least partially reveal the underlying barrier layer 18B and 18A according to a conventional tungsten metal dry etch back process, for example, using sulfur-hexafluoride $SF_6$ and optionally chlorine or bromine as an etching chemistry.

It has been found that during the etchback process, a metallic etching residue, formed by a chemical reaction between the etching chemistry and the barrier layer, is formed during dry etching of the barrier layer e.g., 18B and/or 18A, believed to be a titanium/fluoride compound e.g., ($TiF_x$) and also believed to include sulfur. Regardless of the precise chemical formulation of the metallic etching residue, it has been determined that the metallic etching residue is responsible for causing scratching in a subsequent metal CMP process.

For example, following the tungsten etchback process as described by reference to FIG. 1D, according to an aspect of the present invention, a wafer cleaning process using a hydrofluoric acid containing cleaning solution is used to remove the metallic residue, for example the titanium/fluorine (e.g., $TiF_x$) containing residue formed during the dry tungsten etchback process. Preferably, at least a brush cleaning process using a hydrofluoric acid containing cleaning solution is used. For example, a DNS (Dai Nippon Screen brush) cleaner has suitable properties for brush cleaning the process wafer according to an embodiment of the present invention. For example, the DNS Model AS-2000 (DNS brush cleaner) cleans the wafer using a combination of rinsing, megasonic rinsing, and brush cleaning and is suitably used in a preferred cleaning process according to an embodiment of the invention. Preferably the brush cleaning process includes the use of polyvinyl alcohol (PVA) brushes where the cleaning solution may be sprayed or dripped onto the wafer surface or provided through the brush.

Preferably, the HF cleaning solution is a 0.5 percent to about 1.5 percent by volume HF in deionized water, more preferably about a 1 percent by volume. For example, the dilute HF cleaning solution is formed by a volumetric mixture of about 1:50 ratio of electronic grade HF (49% HF) in deionized water. In a preferred embodiment, the cleaning process using a brush scrubbing process is carried out for a period of about 6 seconds to about 18 seconds. For example, following the tungsten etchback process at least a portion of the barrier layer is revealed. During the wafer cleaning process it is important not to overetch the barrier layer in order to prevent creating larger or new voids and keyholes in the tungsten plugs.

Figure 1E:
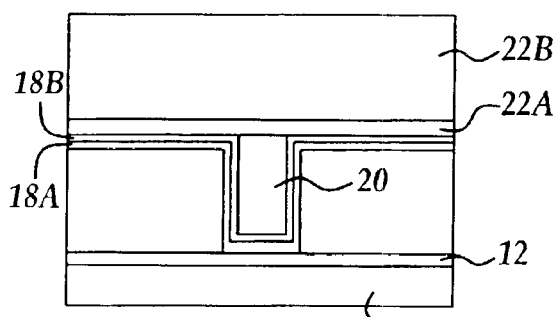

Referring to FIG. 1E, following the wafer cleaning process a titanium containing layer, preferably including a first layer 22A of titanium nitride (e.g., TiN) of about 50 to about 150 Angstroms is deposited by a conventional PVD process followed by PVD deposition of a titanium (Ti) layer 22B to a thickness of about 1200 Angstroms to about 1700 Angstroms, more preferably about 1400 to about 1600 Angstroms. It will be appreciated that the TiN layer 22A may be formed by a conventional nitridation process following PVD deposition of titanium layer 22B. According to an aspect of the present invention, the deposition of the TiN layer 22A and the Ti layer 22B are for the purpose of filling in any keyholes or voids formed in the tungsten plug filling process and exposed following the dry etchback process.

Figure 1F:
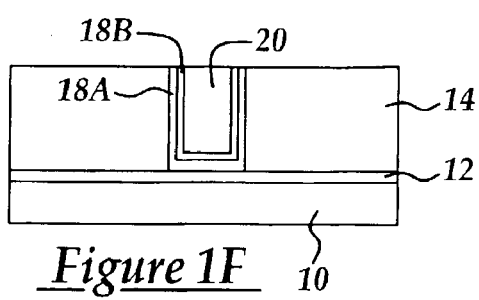

Referring to FIG. 1F, following the deposition of the titanium containing layer, e.g., 22A and 22B, a conventional titanium CMP process is used to remove the overlying titanium containing layer, for example, Ti layer 22B and TiN layer 22A above the tungsten plug level followed by a conventional oxide buffing process of the IMD layer 14 to remove any scratches from the CMP process.

It has been found that the titanium/fluorine containing residue formed during the dry etchback process of the tungsten metal layer above the plug level causes severe scratching in the titanium CMP process. For example the scratches include both macro scratching, visible to the naked eye and micro scratching visible on a visible microscope magnification of about 50× to about 200×. The wafer cleaning process of the present invention removes the titanium/fluorine containing residue and reduces scratching to produce a relatively scratch free surface (by optical microscopy) following the titanium CMP process as well as producing a keyhole-free tungsten plug.

In another aspect of the invention, the titanium CMP process includes an over polish time of about 0 seconds to about 20 seconds is used following polishing the overlying titanium metal layer to reveal the (TiN) layer. It is important to limit the over polish time to avoid reforming keyhole or voids revealed in the tungsten etchback process.

Thus, according to the present invention a method has been provided to reduce wafer surface scratching to produce a relatively scratch-free wafer surface following a tungsten etchback process and a subsequent metal CMP process, thereby improving the subsequent metal CMP process. In addition the method of the present invention provides a method to produce keyhole free tungsten plugs following a tungsten etchback process.

Figure 2:
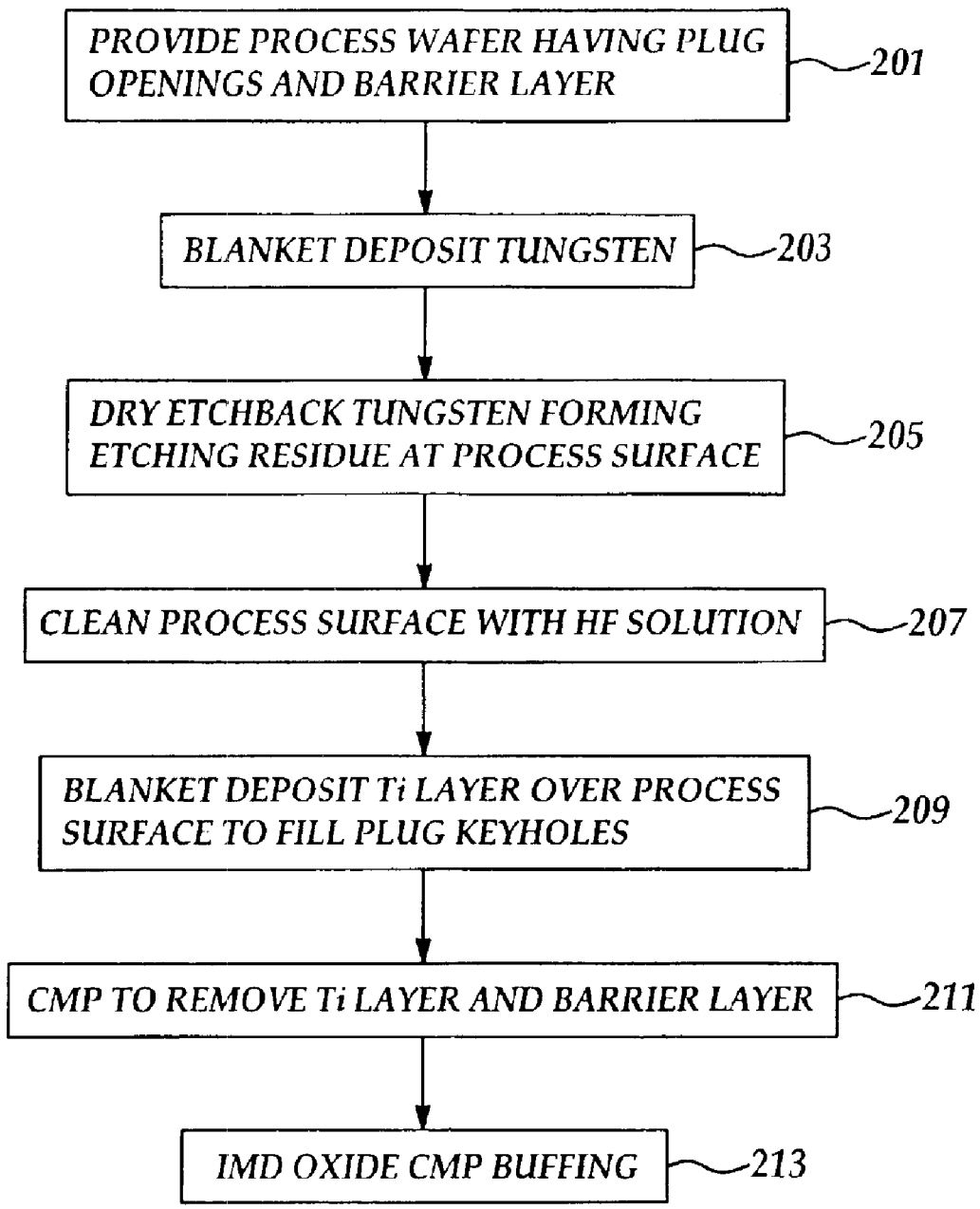
FIG. 2 is a process flow diagram including several embodiments of the present invention.

Referring to FIG. 2 is a process flow diagram including several embodiments of the present invention. In a first process 201 a dielectric insulating layer (IMD layer) is provided including plug openings lined with a titanium containing barrier layer. In process 203, a tungsten layer is blanket deposited to fill the plug openings. In process 205, a dry etchback process is used to remove the tungsten layer above the plug to reveal at least a portion of the barrier layer thereby producing a titanium fluoride containing etching residue. In process 207, a cleaning process using an HF containing cleaning solution is used to the etching residue. In process 209, a titanium containing layer is blanket deposited over the tungsten filled plugs to fill in tungsten plug keyholes and voids. In process 211, a titanium CMP process is carried out to remove the titanium containing layer above the plug level. In process 213, an oxide buffing process is carried out to remove scratches introduced during the titanium CMP process.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for reducing wafer surface scratching in a tungsten CMP process comprising the steps of:
    providing a semiconductor wafer having a process surface comprising an uppermost tungsten layer overlying a barrier layer;
    dry etching comprising a fluorine containing etching chemistry to remove a portion of the tungsten layer to reveal a portion of the barrier layer;
    then cleaning the process surface with a hydrofluoric acid (HF) containing cleaning solution;
    then forming a metal containing layer on the tungsten layer; and,
    then carrying out a chemical mechanical polishing (CMP) process to remove at least a portion of the metal containing layer.

2. The method of claim 1, wherein the step of dry etching forms a metal and fluorine containing etching residue.

3. The method of claim 1, wherein the tungsten layer fills an etched opening formed in a dielectric insulating layer.

4. The method of claim 1, wherein the barrier layer comprises titanium.

5. The method of claim 1, wherein the barrier layer comprises a bilayer of titanium and titanium nitride.

6. The method of claim 1, wherein the fluorine containing etching chemistry comprises sulfur hexafluoride.

7. The method of claim 1, wherein the wherein the metal and fluorine containing etching residue comprises titanium.

8. The method of claim 1, wherein the step of cleaning comprises at least a brush scrubbing process while simultaneously applying the cleaning solution.

9. The method of claim 1, wherein the metal containing layer comprises a material selected from the group consisting of titanium, TiN, and TiN/Ti.

10. The method of claim 1, wherein the step of forming a metal containing layer comprises filling voids in the tungsten layer revealed in the step of dry etching.

11. The method of claim 1, wherein the HF containing cleaning solution includes about 0.5 to about 1.5 volume percent HF in deionized water with respect to a cleaning solution volume.

12. The method of claim 11, wherein the HF containing cleaning solution includes about 1 volume percent HF in deionized water with respect to a cleaning solution volume.

13. A method for reducing wafer surface scratching in titanium CMP process to provide keyhole-free tungsten plugs comprising the steps of:
    providing a semiconductor wafer having a process surface comprising an uppermost tungsten layer, said tungsten layer filling a plug opening formed in a dielectric insulating layer, the plug opening lined with a titanium containing barrier layer;
    dry etching the tungsten layer comprising a fluorine containing etching chemistry to remove a portion of the tungsten layer to reveal at least a portion of the titanium containing barrier layer to form an etching residue at the process surface;
    then cleaning the process surface with a hydrofluoric acid (HF) containing cleaning solution to remove the etching residue;
    then forming a second titanium containing layer over the process surface; and,
    then carrying out a CMP process to remove the second titanium containing layer and the titanium containing barrier layer above the tungsten filled plug level.

14. The method of claim 13, wherein the HF containing cleaning solution comprises from about 0.8 to about 1.2 volume percent HF in deionized water with respect to a cleaning solution volume.

15. The method of claim 13, wherein the step of cleaning the process surface comprises a process selected from the group consisting of a megasonic and brush scrubbing process.

16. The method of claim 13, wherein the fluorine containing etching chemistry comprises sulfur hexafluoride ($SF_6$).

17. The method of claim 13, wherein the titanium containing barrier layer comprises a material selected from the group consisting of titanium, titanium nitride, and Ti/TiN.

18. The method of claim 13, wherein the step of cleaning comprises a brush cleaning process carried out from about 6 seconds to about 18 seconds.

19. The method of claim 13, wherein the second titanium containing layer is deposited to a thickness of from about 1200 to about 1700 Angstroms.

20. The method of claim 13, wherein the etching residue comprises a material selected from the group consisting of titanium, sulphur, and fluorine.

21. The method of claim 13, wherein the second titanium containing layer comprises a material selected from the group consisting of titanium, TiN, and TiN/Ti.

22. The method of claim 13, wherein the step of forming a second titanium containing layer comprises filling keyholes present in the tungsten filled plug.

* * * * *